(12) United States Patent  
Chakraborty

(10) Patent No.: US 9,287,469 B2  
(45) Date of Patent: Mar. 15, 2016

(54) ENCAPSULATION FOR PHOSPHOR-CONVERTED WHITE LIGHT EMITTING DIODE

(75) Inventor: Arpan Chakraborty, Goleta, CA (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 12/151,089

(22) Filed: May 2, 2008

(65) Prior Publication Data

US 2009/0272996 A1    Nov. 5, 2009

(51) Int. Cl.
*H01L 33/44*    (2010.01)
*H01L 33/50*    (2010.01)
*H01L 33/60*    (2010.01)

(52) U.S. Cl.
CPC .............. *H01L 33/501* (2013.01); *H01L 33/60* (2013.01); *H01L 2924/0002* (2013.01); *H01L 2933/0091* (2013.01)

(58) Field of Classification Search
CPC ............ H01L 2933/0091; H01L 33/56; H01L 33/507; H01L 33/501
USPC ........................ 257/99, 100, E23.119; 438/27
See application file for complete search history.

(56) References Cited

U.S. PATENT DOCUMENTS

| | | | |
|---|---|---|---|
| 4,152,044 A | 5/1979 | Liu | |
| 4,675,575 A | 6/1987 | Smith et al. | 315/185 S |
| 4,914,489 A | 4/1990 | Awano | 257/6 |
| 4,963,948 A | 10/1990 | Awano | 257/183 |
| 5,034,783 A | 7/1991 | Chang et al. | 257/192 |
| 5,477,436 A | 12/1995 | Bertling et al. | |
| 5,628,917 A | 5/1997 | MacDonald et al. | 216/2 |
| 6,046,464 A | 4/2000 | Schetzina | 257/96 |
| 6,150,672 A | 11/2000 | Kaneko | 257/94 |
| 6,330,111 B1 | 12/2001 | Myers | |
| 6,331,915 B1 | 12/2001 | Myers | |
| 6,331,944 B1 | 12/2001 | Monsma et al. | 365/171 |
| 6,389,051 B1 | 5/2002 | Van de Walle et al. | 372/45.01 |
| 6,482,711 B1 | 11/2002 | Nguyen et al. | 438/317 |
| 6,504,179 B1 | 1/2003 | Ellens et al. | 257/88 |

(Continued)

FOREIGN PATENT DOCUMENTS

| | | |
|---|---|---|
| BE | 20090254 | 7/2011 |
| CN | 1698202 | 11/2005 |

(Continued)

OTHER PUBLICATIONS

Notice Requesting Submission of Opinion re related Korean application No. 10-2004-7001033, dated: Mar. 9, 2009.

(Continued)

*Primary Examiner* — John C Ingham
(74) *Attorney, Agent, or Firm* — Koppel Patrick Heybl & Philpott

(57) ABSTRACT

An improved light emitting device, especially a phosphor-converted white light device, wherein the light extraction efficiency and the color temperature distribution uniformity are improved by the introduction of both nanoparticles and light scattering particles proximate to the light source. Nanoparticles having a high index of refraction are dispersed throughout a wavelength conversion layer to adjust the index of refraction of the layer for improved light extraction. Light scattering particles may be dispersed in the wavelength conversion layer and/or in a surrounding medium to improve the spatial correlated color temperature uniformity.

58 Claims, 4 Drawing Sheets

(56) References Cited

U.S. PATENT DOCUMENTS

| | | | |
|---|---|---|---|
| 6,526,082 B1 | 2/2003 | Corzine et al. | 372/46.01 |
| 6,653,765 B1 | 11/2003 | Levinson et al. | 313/112 |
| 6,657,393 B2 | 12/2003 | Natsume | |
| 6,746,889 B1 | 6/2004 | Eliashevich et al. | |
| 6,784,463 B2 | 8/2004 | Camras et al. | |
| 6,791,259 B1 | 9/2004 | Stokes | |
| 6,870,311 B2 | 3/2005 | Mueller et al. | 313/491 |
| 6,878,975 B2 | 4/2005 | Hueschen | 257/104 |
| 6,882,051 B2 | 4/2005 | Majumdar et al. | 257/746 |
| 6,932,497 B1 | 8/2005 | Huang | |
| 6,949,774 B2 | 9/2005 | Parikh et al. | 257/104 |
| 7,005,679 B2 | 2/2006 | Tarsa et al. | 257/89 |
| 7,083,490 B2 * | 8/2006 | Mueller et al. | 445/24 |
| 7,087,936 B2 | 8/2006 | Negley | |
| 7,102,152 B2 | 9/2006 | Chua et al. | |
| 7,194,170 B2 | 3/2007 | Biegelsen | 385/116 |
| 7,214,626 B2 | 5/2007 | Huang | 438/734 |
| 7,391,046 B2 * | 6/2008 | Tsutsumi et al. | 257/13 |
| 7,491,626 B2 | 2/2009 | Gaska et al. | 438/483 |
| 7,514,867 B2 | 4/2009 | Yano et al. | 313/512 |
| 7,868,341 B2 * | 1/2011 | Diana et al. | 257/98 |
| 2002/0015013 A1 | 2/2002 | Ragle | |
| 2002/0054495 A1 | 5/2002 | Natsume | |
| 2002/0080615 A1 | 6/2002 | Marshall et al. | 362/333 |
| 2002/0180351 A1 | 12/2002 | Mc Nulty | |
| 2002/0187571 A1 * | 12/2002 | Collins et al. | 438/29 |
| 2003/0015708 A1 | 1/2003 | Parikh et al. | |
| 2003/0038596 A1 | 2/2003 | Ho | 313/512 |
| 2003/0085409 A1 | 5/2003 | Shen | |
| 2003/0156425 A1 | 8/2003 | Turnbull et al. | |
| 2003/0218183 A1 | 11/2003 | Micovic et al. | 257/192 |
| 2004/0012027 A1 | 1/2004 | Keller et al. | 257/79 |
| 2004/0094757 A1 | 5/2004 | Braune et al. | |
| 2004/0206966 A1 | 10/2004 | Sugawara et al. | 257/85 |
| 2004/0207313 A1 | 10/2004 | Omoto et al. | |
| 2004/0217364 A1 | 11/2004 | Tarsa et al. | 257/89 |
| 2005/0077535 A1 | 4/2005 | Li | |
| 2005/0117320 A1 | 6/2005 | Leu et al. | |
| 2005/0122720 A1 | 6/2005 | Shimonaka et al. | 362/257 |
| 2005/0152127 A1 | 7/2005 | Kamiya et al. | 362/64 |
| 2005/0158637 A1 | 7/2005 | Kim et al. | |
| 2005/0162845 A1 | 7/2005 | McDermott | |
| 2005/0168994 A1 | 8/2005 | Jacobson et al. | |
| 2005/0173692 A1 | 8/2005 | Park et al. | |
| 2005/0173728 A1 | 8/2005 | Saxler | |
| 2005/0189539 A1 | 9/2005 | Furukawa et al. | |
| 2005/0219668 A1 | 10/2005 | Taghizadeh | |
| 2005/0224821 A1 | 10/2005 | Sakano et al. | 257/79 |
| 2005/0224829 A1 * | 10/2005 | Negley et al. | 257/99 |
| 2005/0280007 A1 * | 12/2005 | Hsu et al. | 257/79 |
| 2006/0063289 A1 | 3/2006 | Negley | |
| 2006/0081862 A1 | 4/2006 | Chua et al. | |
| 2006/0158899 A1 | 7/2006 | Ayabe et al. | |
| 2006/0189013 A1 | 8/2006 | Schardt et al. | |
| 2006/0220046 A1 | 10/2006 | Yu et al. | 257/98 |
| 2006/0228973 A1 | 10/2006 | Janning | |
| 2006/0244358 A1 * | 11/2006 | Kim et al. | 313/486 |
| 2006/0258028 A1 | 11/2006 | Paolini | 438/22 |
| 2007/0007558 A1 | 1/2007 | Mazzochette | |
| 2007/0041101 A1 * | 2/2007 | Goosey et al. | 359/676 |
| 2007/0090383 A1 | 4/2007 | Ota | |
| 2007/0268694 A1 | 11/2007 | Bailey et al. | 362/231 |
| 2008/0036364 A1 | 2/2008 | Li et al. | |
| 2008/0048200 A1 | 2/2008 | Mueller et al. | 257/98 |
| 2008/0074032 A1 | 3/2008 | Yano et al. | 313/503 |
| 2008/0094829 A1 | 4/2008 | Narendran et al. | 362/231 |
| 2008/0210961 A1 | 9/2008 | Lin et al. | 257/98 |
| 2008/0225528 A1 | 9/2008 | Holder et al. | 362/326 |
| 2008/0278655 A1 | 11/2008 | Moon et al. | 349/58 |
| 2009/0008662 A1 | 1/2009 | Ashdown et al. | 257/98 |
| 2009/0026908 A1 | 1/2009 | Bechtel et al. | H01L 33/00 |
| 2009/0050911 A1 | 2/2009 | Chakraborty | |
| 2009/0135581 A1 | 5/2009 | Yano et al. | 362/84 |
| 2009/0173960 A1 | 7/2009 | Martin et al. | 257/98 |
| 2009/0267090 A1 | 10/2009 | Chang et al. | |
| 2010/0103678 A1 | 4/2010 | Van de Ven et al. | 362/294 |
| 2011/0215347 A1 | 9/2011 | Wong et al. | |
| 2011/0266574 A1 | 11/2011 | Liao et al. | |
| 2011/0273079 A1 | 11/2011 | Pickard et al. | 313/483 |
| 2012/0229018 A1 | 9/2012 | Lenk et al. | 313/503 |

FOREIGN PATENT DOCUMENTS

| | | |
|---|---|---|
| CN | 1698202 A | 11/2005 |
| CN | 1910762 | 2/2007 |
| CN | 1910762 A | 2/2007 |
| EP | 0936682 | 8/1999 |
| EP | 0936682 A | 8/1999 |
| EP | 1349202 A | 10/2003 |
| EP | 1 369 935 A1 | 12/2003 |
| EP | 1369935 A1 | 12/2003 |
| EP | 1653255 | 5/2006 |
| EP | 1681509 | 7/2006 |
| EP | 1 737 050 A1 | 12/2006 |
| EP | 1737050 A1 | 12/2006 |
| FR | 2586844 | 3/1987 |
| FR | 2759188 | 8/1998 |
| FR | 2814220 | 3/2002 |
| JP | S6092678 | 5/1985 |
| JP | 03206672 | 9/1991 |
| JP | H03-206672 | 9/1991 |
| JP | H03206672 | 9/1991 |
| JP | H03206673 | 9/1991 |
| JP | H04137570 | 5/1992 |
| JP | 11-307813 | 11/1999 |
| JP | 2001148515 | 5/2001 |
| JP | 2002033517 | 1/2002 |
| JP | 2002-057376 | 2/2002 |
| JP | 2002299694 | 10/2002 |
| JP | 2003031008 | 1/2003 |
| JP | 2004165541 | 6/2004 |
| JP | 2004259541 | 9/2004 |
| JP | 2004341445 | 12/2004 |
| JP | 2005183193 | 7/2005 |
| JP | 2005210042 | 8/2005 |
| JP | 2005524737 A | 8/2005 |
| JP | 2005-232305 | 9/2005 |
| JP | 2006114900 | 4/2006 |
| JP | 2006269778 | 10/2006 |
| JP | 2006-313902 | 11/2006 |
| JP | 2006313902 | 11/2006 |
| JP | 2007035802 | 2/2007 |
| JP | 2007-149909 | 6/2007 |
| JP | 2007294197 | 11/2007 |
| JP | 2008060068 | 3/2008 |
| JP | 2008084990 | 4/2008 |
| JP | 2009054995 A | 3/2009 |
| TW | 200633249 | 9/2006 |
| TW | 200642011 | 12/2006 |
| WO | WO 9856043 | 12/1998 |
| WO | WO 02011212 A | 2/2002 |
| WO | 03044870 | 5/2003 |
| WO | WO 03080763 | 10/2003 |
| WO | WO 2005067066 | 7/2005 |
| WO | WO 2005091387 | 9/2005 |
| WO | WO 2005/104247 A | 11/2005 |
| WO | WO 2005104247 | 11/2005 |
| WO | WO 2006/048064 | 5/2006 |
| WO | WO 2006105646 | 10/2006 |
| WO | WO 2007005844 A | 1/2007 |
| WO | WO 2008156518 | 12/2008 |
| WO | WO 2009156518 A1 | 12/2008 |
| WO | WO 2010070120 | 6/2010 |
| WO | WO 2011020098 | 2/2011 |
| WO | WO 2011118178 | 9/2011 |
| WO | WO 2012047505 | 12/2012 |
| WO | WO 2012047937 | 12/2012 |

OTHER PUBLICATIONS

Zhang et al. "Comparison of GaN P—I—N and Schottky Rectifier Performance", IEEE Transactions on Electron Devices, vol. 48, No. 3, Mar. 2001, pp. 407-411.

(56) References Cited

OTHER PUBLICATIONS

Sakai et al., "Experimental Investigation of Dependence of Electrical Characteristics on Device Parameters in Trench MOS Barrier Schottky Diodes", 1998, International Symposium on Power Semiconductor Devices & ICs, Kyoto, pp. 293-296.
European Search Report re related European Application No. 08253301.9-2222.2-24-09.
European Search Report re related EP Appl. 08160129.6.2222, Dated: Dec. 15, 2008.
Asbeck et al."Enhancement of Base Conductivity via the Piezoelectric Effect in AlGaN/GaN HBTs", Solid State Electronics, Elsevier Science Pub. Barking GB, vol. 44, No. 2, Feb. 1, 2000 pp. 211-219, XP004186190.
Johnson et al."New UV Light Emitter Based on AlGaN Heterostructures with Graded Electron and Hole Injectors", Materials Research Society Symposium—Proceedings 2002 Materials Research Society US, vol. 743, 2002, pp. 481-486.
Simon et al. "Polarization-Induced 3-Dimensional Electron Slabs in Graded AlGaN Layers", Materials Research Society Symposium Proceedings 2006 Materials Research Society US, vol. 892, Nov. 28, 2005, pp. 417-422.
Official Notice of Final Decision of Rejection re related Japanese Patent Appl. No. 2003-529535, Dated: Jan. 6, 2009.
European Communication from related European Appl. 02 798 906.0-1235, Dated Feb. 6, 2009.
Sakai et al., "Experimental Investigation of Dependence of Electrical Characteristics on Device Parameters in Trench MOS Barrier Shottky Diodes", Proceedings of 1998 International Symposium on Power Semiconductor Devices & ICs, Kyoto, pp. 293-296, Jun. 1998.
Zhang AP et al, "Comparison of GAN P—I—N and Schottky Rectifier Performance" IEEE Transactions on Electron Devices, IEEE Inc. New York, US, vol. 48, No. 3, pp. 407-411, Mar. 2001.
European Search Report, Feb. 24, 2009, re related European Application No. EP 08253301.
Notice of First Office Action from related China Patent Application No. 200710142217.6, dated: Jun. 22, 2009.
The Second Office Action from People's Republic of China, re: China Application No. 200480027969.2, Date: Jul. 4, 2008.
International Search Report for PCT/US2008/004453, Date: Sep. 9, 2008.
Written Opinion for PCT/US2008/004453, Date: Sep. 9, 2008.
Kim J K et al. "Strongly Enhanced Phosphor Efficiency in GaInN White Light-Emitting Diodes Using Remote Phosphor Configuration and Diffuse Reflector Cup", Japanese Journal of Applied Physics, Japan Society of Applied Physics, Tokyo, JP, vol. 44, No. 20-23, January 1, 2005, XP-001236966.
(From related application) Canadian Patent Application No. 2,454,310, Office Action dated Feb. 9, 2010.
Office Action from related U.S. Appl. No. 11/600,617, Dated: Dec. 22, 2009.
European Search Report from related European Application No. 07254498.4, received on Feb. 11, 2010.
Official Communication from the EPO regarding related European Application 08253301.9, dated: Nov. 17, 2009.
Second Office Action from related Chinese Application No. 200710142217.6, dated: Nov. 6, 2009.
Copending U.S. Appl. No. 11/443,741, date: Jun. 14, 2007.
Copending U.S. Appl. No. 11/685,761, date: Mar. 13, 2007.
Copending U.S. Appl. No. 11/939,059, date: Nov. 13, 2007.
PCT Search Report and Written Opinion PCT/US2007/086237, date: May 8, 2008 in related application.
PCT Search Report and Written Opinion PCT/US2007/12403, Date: Aug. 6, 2008.
PCT Search Report and Written Opinion PCT/US2007/086242, Date: Mar. 4, 2008.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/736,799, filed Apr. 18, 2007.
U.S. Appl. No. 11/877,038, filed Oct. 23, 2007.
U.S. Appl. No. 11/870,679, filed Oct. 11, 2007.
U.S. Appl. No. 11/948,041, filed Nov. 30, 2007.
U.S. Appl. No. 11/949,222, filed Dec. 3, 2007.
U.S. Appl. No. 12/174,053, filed Jul. 16, 2008.
U.S. Appl. No. 12/002,429, filed Dec. 4, 2007.
U.S. Appl. No. 12/045,729, filed Mar. 11, 2008.
U.S. Appl. No. 11/818,818, filed Jun. 14, 2007.
Invitation to Submit Applicant's Opinion (Summary) in Japanese Appeal Filing No. 2009-007421, Japanese Patent Application No. 2003-529535 mailed Dec. 7, 2010.
Examiner's Report to the Board (Summary) in Japanese Appeal Filing No. 2009-007421, Japanese Patent Application No. 2003-529535 mailed Dec. 7, 2010.
Office Action from U.S. Appl. No. 11/498,418. dated: Dec. 16, 2009.
Office Action from U.S. Appl. No. 11/498,418, dated: Sep. 15, 2010.
Office Action from U.S. Appl. No. 11/974,431, dated:Sep. 22, 2010.
Notification of National Application Upon the Preliminary Examination of Patent Application from Chinese Patent Application No. 200880100370.5 dated Jun. 1, 2010.
Notification on Publication and Entry into Procedure of Substantive Examination of Invention Patent Application from Chinese Patent Application No. 200880100370.5 dated Aug. 18, 2010.
Office Action from U.S. Appl. No. 11/498,418, dated Dec. 16, 2009.
Response to Office Action from U.S. Appl. No. 11/498,418, filed Apr. 16, 2010.
Office Action from U.S. Appl. No. 11/498,418, dated Sep. 15, 2010.
Response to Office Action from U.S. Appl. No. 11/498,418, filed Dec. 13, 2010.
Office Action from U.S. Appl. No. 11/982,275, dated Jan. 13, 2011.
Office Action from U.S. Appl. No. 11/974,431, dated Feb. 16, 2011.
Office Action from U.S. Appl. No. 11/974,431, dated: Sep. 22, 2010.
Response to Office Action from U.S. Appl. No. 11/974,431, filed Nov. 9, 2010.
Office Action from U.S. Appl. No. 11/818,818, dated: May 11, 2010.
Response to Office Action from U.S. Appl. No. 11/818,818, filed Oct. 19, 2010.
Office Action from U.S. Appl. No. 11/900,952, dated: Jul. 23, 2010.
Response to Office Action from U.S. Appl. No. 11/900,952, filed Dec. 22, 2010.
Office Action from U.S. Appl. No. 11/982,275, dated: Aug. 20, 2010.
Response to Office Action from U.S. Appl. No. 11/982,275, filed Nov. 9, 2010.
Office Action from U.S. Appl. No. 11/173,035, dated: Oct. 6, 2010.
Examiners interview in response to Office Action from U.S. Appl. No. 11/173,0354 dated: Feb. 16, 2011.
Office Action from U.S. Appl. No. 11/900,952, dated: Feb. 26, 2010.
Response to Office Action from U.S. Appl. No. 11/900,952, filed May 26, 2010.
Office Action from U.S. Appl. No. 11/974,431, dated: Apr. 14, 2010.
Response to Office Action from U.S. Appl. No. 11/974,431, filed Jul. 6, 2010.
Office Action from U.S. Appl. No. 11/173,035, dated: Apr. 1, 2010.
Response to Office Action from U.S. Appl. No. 11/173,035, filed Jun. 1, 2010.
Office Action from U.S. Appl. No. 11/895,573, dated: Feb. 18, 2010.
Response to Office Action from U.S. Appl. No. 11/895,573, filed May 6, 2010.
Office Action from U.S. Appl. No. 11/895,573, dated: May 19, 2010.
Response to Office Action from U.S. Appl. No. 11/895,573. filed Oct. 19, 2010.
Office Action from U.S. Appl. No. 11/895,573, dated: Jan. 7, 2011.

(56) References Cited

OTHER PUBLICATIONS

Response to Office Action from U.S. Appl. No. 11/895,573, filed Jun. 24, 2011.
Office Action from U.S. Appl. No. 11/895,573, dated: Sep. 13, 2011.
Response to Office Action from U.S. Appl. No. 11/895,573, filed Dec. 1, 2011.
Notice of Allowance from U.S. Appl. No. 11/818,818, dated: Jun. 29, 2011.
Office Action for German Patent Application No. 10 2008 029 318.0 dated Oct. 19, 2010.
Office Action for Japanese Patent Application No. JP 2008-163311 issued Mar. 29, 2011.
Notification of the First Office Action for Chinese Patent Application No. CN 200880100370.5 mailed Apr. 26, 2011.
International Search Report and Written Opinion for PCT Application No. PCT/US2008/004453 mailed Sep. 9, 2008.
Kim, J.K., et al., "Strongly Enhanced Phosphor Efficiency in GaInN White Light-Emitting Diodes using Remote Phosphor Configuration and Diffuse Reflector Cup" Japanese Journal of Applied Physics, Japan Society of Applied Physics, Tokyo, JP vol. 44, No. 20-23, Jan. 1, 2005, pp. L649-L651.
Extended European Search Report for counterpart European Patent Application No. 09159268.3 dated Aug. 22, 2011.
Notification of Reasons for Rejection for counterpart Japanese Patent Application No. 2009-112468 dated Oct. 18, 2011.
Final Rejection for Japanese Patent Application No. 2008-163311 mailed Dec. 1, 2011.
Summary of Notice of Reasons for Rejection for Japanese Patent Application No. 2010-512143 mailed Jan. 10, 2012.
Notification of Second Office Action for Chinese Patent Application 200880100370.5, dated Feb. 22, 2012.
Decision for Grant for Japanese Patent Application No. 2010-512143, Issued Jul. 3, 2012.
Third Office Action from Chinese Patent Application No. 200880100370.5, dated Sep. 29, 2012.
Notification of Reasons for Rejection from Japanese Patent Application No. 2009-112468. dated Nov. 1, 2012.
Office Action from Japanese Patent Application No. 2012-519534, dated Apr. 12, 2013.
Third Office Action from Chinese Patent Appl. No. 200980129742.1, dated Jun. 20, 2013.
Appeal Board's Questioning from Japanese Patent appl. No. 2011-511641, dated Jul. 8, 2013.
Decision of Rejection from Japanese Patent appl. No. 2012-519534, dated Jul. 24, 2013.
Official Action from European Patent Appl. No. 08 754 071.2-1551, dated May 8, 2013.
Decision of Rejection from Chinese Patent Application No. 2008801017370.5, dated May 2, 2013.
Office Action from Japanese Patent Appl. No. 2012-191540, dated Aug. 9, 2013.
Office Action from U.S. Appl. No. 13/169,866, dated Apr. 4, 2013.
Office Action from U.S. Appl. No. 12/475,261, dated Apr. 2, 2013.
Response to OA from U.S. Appl. No. 12/475,261, filed Aug. 22, 2013.
Office Action from U.S. Appl. No. 11/895,573, dated Jun. 18, 2013.
Office Action from U.S. Appl. No. 13/169,866, dated Nov. 7, 2012.
Response to OA from U.S. Appl. No. 13/169,866, filed Jan. 4, 2013.
Office Action from U.S. Appl. No. 11/895,573, dated Sep. 24, 2012.
Response to OA from U.S. Appl. No. 11/895,573, filed Nov. 21, 2012.
Office Action from U.S. Appl. No 13/169,866 dated Apr. 24, 2012.
Response to OA from U.S. Appl. No. 13/169,866, filed Jul. 19, 2012.
Office Action from U.S. Appl. No. 11/895,573, dated Apr. 24, 2012.
Response to OA from U.S. Appl. No. 11/895,573, filed Aug. 13, 2012.
Reasons for Rejection from Japanese Patent Appl. No. 2012-083671, dated Aug. 26. 2013 (Received Oct. 2, 2013).
Office Action from U.S. Appl. No. 13/169,866, dated Apr. 24, 2012.
Fourth Office Action from Chinese Patent Appl. No. 200880100370. 5. dated Nov. 15, 2013.
Office Action from U.S. Appl. No. 13/169,666, dated Oct. 18, 2013.
Response to OA from U.S. Appl. No. 13/169,866, filed Dec. 17, 2013.
Office Action from U.S. Appl. No. 13/169,866, dated: Oct. 18, 2013.
Decision of Rejection from Japanese Patent Appl. No. 2012-083671, dated: Mar. 11, 2014.
Examination Report from European Patent Appl. No. 09 758 707.5-1565, dated Apr. 4, 2014.
Office Action from Taiwanese Patent Appl. No. 098118090, dated Apr. 3, 2014.
Search Report from Taiwanese Patent Appl. No. 098118090, dated Apr. 3. 2014.
Re-examination Report from Japanese Patent appl. No. 2012-519534, dated Feb. 24, 2014.
Decision of Rejection from Japanese Patent Appl. No. 2012-191540, dated Mar. 19, 2014.
Decision of Rejection from Chinese Patent Appl. No. 200980129742. 1, dated: Jan. 6, 2014.
Office Action from Japanese Patent Appl. No. 2011-511641, dated Jan, 31, 2014.
First Office Action and Search Report from Chinese Patent appl. No. 201080330421.9, dated Feb. 12, 2014.
Office Action from U.S. Appl. No. 11/895,573, dated Jan. 15, 2014.
Response to OA from U.S. Appl. No. 11/895,573, filed Mar. 13, 2014.
Office Action from U.S. Appl. No. 12/745,261, dated Feb. 27, 2014.
Office Action from U.S. Appl. No. 13/169,866, dated Feb. 7, 2014.
Office Action from Taiwanese Patent Appl. No. 098118090, dated Apr. 11, 2014.
Office Action and Search Report from Taiwanese Patent Appl. No. 097113543, dated Jun. 3, 2014.
Decision of Appeal against Japanese Patent Appl. No. 2011-511641, dated Jul. 18, 2014.
Office Action from U.S. Appl. No. 12/475,261, dated Jun. 10, 2014.
Response to OA from U.S. Appl. No. 12/475,261, filed Aug. 8, 2014.
Office Action from U.S. Appl. No. 13/169,866, dated Jul. 17, 2014.
Office Action from U.S. Appl. No. 11/895,573, dated Sep. 23, 2014.
Decision from Taiwanese Patent Appl. No. 098118090, dated Sep. 22, 2014.
Office Action and Search Report from Taiwanese Appl. No. 097113543, dated Oct. 30, 2014.
Preliminary Report from Japanese Appl. No. 2012-083671. dated Aug. 21, 2014.
Second Office Action from Chinese Patent Appl. No. 201080030421. 9. dated Sep. 25, 2014.
Notification of Reexamination from Chinese Appl. No. 2009801297421, dated Jan. 13, 2015.
Examiner's Report from European Patent Appl. No. 09 159 268.3-1558, dated Jan. 27, 2015.
Office Action from Taiwanese Patent Appl. No. 099122185 dated Jan. 6. 2015.
Notification of re-examination from Chinese Patent Appl. No. 200980129742.1, dated Apr. 3, 2015.
Office Action from U.S. Appl. No. 12/475,261, dated Feb. 20, 2015.
Office Action from U.S. Appl. No. 13/169,866, dated Mar. 16, 2015.
Appeal Decision (summary) from Japanese Patent Appl. No. 2012-83671, dated Apr. 27, 2015.
Notification of Reexamination from Chinese Patent appl. No. 2009801297421. dated Apr. 3, 2015.
Notice of Allowance from Taiwanese Patent Appl. No. 10420751350, dated Jun. 10, 2015.
Office Action from Korean Patent Appl. No. 10-2010-7029502, dated Jun. 3, 2015.
Office Action from U.S. Appl. No. 11/895,573, dated Apr. 9, 2015.
Fourth Office Action from Chinese Patent Appl. No. 201080030421. 9, dated Nov. 17, 2015.
Office Action from U.S. Appl. No. 11/895,573, dated Oct. 7, 2015.
Response to OA from U.S. Appl. No. 11/895,573, filed Dec. 16, 2015.
Office Action from U.S. Appl. No. 13/169,866, dated Nov. 5, 2015.

* cited by examiner

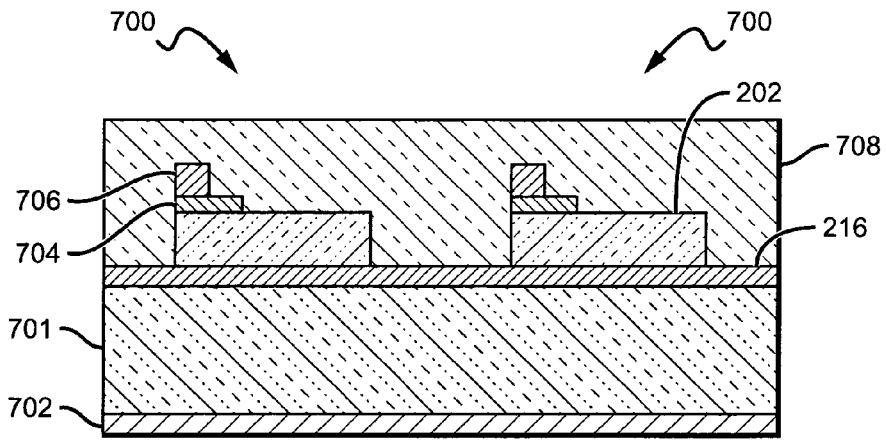
FIG. 7C
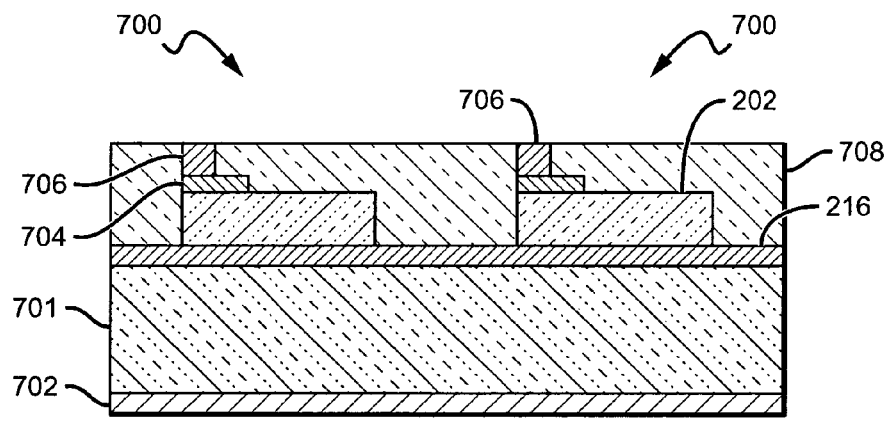
FIG. 7D
FIG. 7E
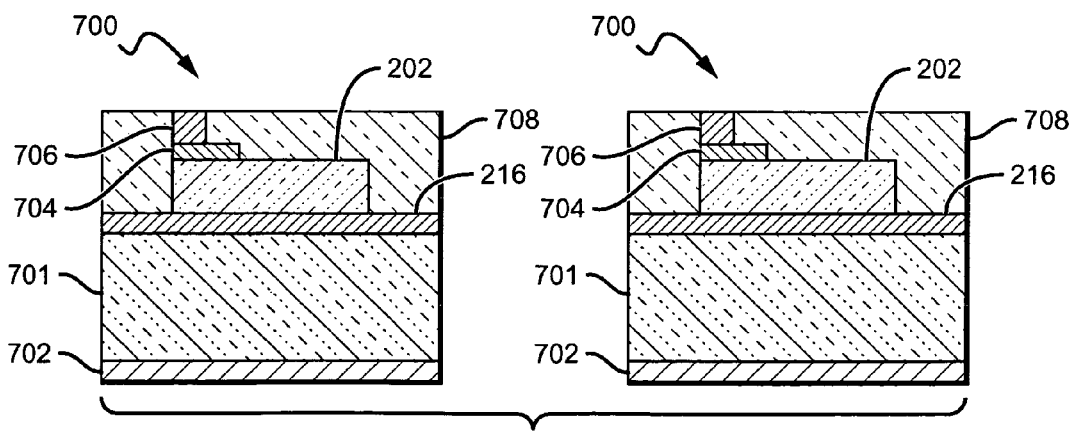

ENCAPSULATION FOR PHOSPHOR-CONVERTED WHITE LIGHT EMITTING DIODE

BACKGROUND OF THE INVENTION

1. Field of the Invention

The present invention relates generally to light emitting diodes (LEDs) and, more particularly, to LEDs having nanoparticles and light scattering particles that improve the light extraction efficiency and spatial color temperature uniformity of the LED device.

2. Description of the Related Art

Solid state light emitting devices, such as inorganic or organic light emitting diodes (LEDs), convert energy to light and are widely used for many applications. As known to those having skill in the art, inorganic solid state devices generally include one or more active regions of semiconductor material interposed between oppositely doped regions. When a bias is applied across the doped regions, electron-hole recombination events occur that generate light, and light is emitted from the active region in omnidirectional paths from all surfaces of the LED. Conventional LEDs may incorporate reflectors and/or mirror surfaces to direct the emitted light in a desired direction.

The color or wavelength emitted by an LED is largely dependent on the properties of the material from which it is generated that determine the bandgap of the active region. LEDs have been built to emit light in a range of colors in the visible spectrum including red, yellow, green, and blue. Other LEDs emit radiation outside the visible spectrum such as in the ultraviolet (UV) range of the electromagnetic spectrum. It is often desirable to incorporate phosphors into a LED to tailor the emission spectrum by converting a portion of the light from the LED before it is emitted. For example, in some blue LEDs a portion of the blue light is "downconverted" to yellow light. Thus, the LED emits a combination of blue and yellow light to generate a spectrum that appears white to the human eye. As used herein, the term "phosphor" is used generically to indicate any photoluminescent material.

Phosphors have been disposed in various regions within the LED structure. For example, phosphor may be dispersed inside and/or coated outside a dome-shaped encapsulant that covers the device. The phosphor may be located remotely from the light emitting die as shown in U.S. Pat. No. 7,286,926. The phosphor may also be coated or deposited on the die itself. Several techniques are frequently used to introduce the phosphor, including electrophoretic deposition, stencil printing, spin or spray coating, etc. Another technique uses a phosphor dispense process where a drop of material, such as epoxy, silicone encapsulant, etc., that contains phosphor therein, may be placed on the die and cured to form a shell over the die. This is sometimes is sometimes referred to as a "glob top" process. In another technique, the drop of material that contains phosphor may be placed above the die, and the phosphor is allowed to settle within the drop. This technique may be referred to as "remote settling".

Many applications require an LED that emits white light. As used herein, the term "white light" is used in a general sense and includes light that different individuals or detectors may perceive as having a slight tint toward, for example, yellow or blue. As discussed above, some conventional LED devices combine a yellow phosphor on a blue LED to achieve white light. Some of the blue light emitted from the LED passes through the phosphor without being converted, and some of the emitted blue light is downconverted to yellow. The combinations of blue light and yellow light that escape the light emitting device provide a white light output.

LEDs have been manufactured that include several other functional features, such as reflective/refractive layers, lenses and light scattering elements, for example. Some LEDs include surfaces that have been textured to enhance light extraction by reducing total internal reflection at various material interfaces. Many other functional features known in the art may be combined to build an LED having particular characteristics.

FIG. 1 shows a cross-sectional view of known LED device 10. An LED chip 11 is disposed on a mount surface 12. A layer of wavelength conversion material 13 surrounds the LED chip 11. An encapsulant 14 covers the LED chip 11 and the conversion layer 13. The LED chip has a textured emission surface 15 that helps to extract light at the interface of the LED chip 11 and the conversion layer 13 by countering the effects of the step-down in index of refraction at the interface. Phosphor particles 16 are shown dispersed throughout the conversion layer 13. Some of the light emitted from the LED chip 11 is reflected or backscattered inside the conversion layer 13, at the interface with encapsulant 14, or within the encapsulant 14 back towards the textured surface 12. Due to the textured surface 15 coupled with a step-up in index of refraction at the interface, a substantial portion of the light incident on the textured surface 15 re-enters the LED chip 11 where it may be absorbed, decreasing the light extraction efficiency of the device 10.

SUMMARY OF THE INVENTION

In one embodiment, a light emitting diode (LED) device comprises the following. An LED chip has a conversion layer disposed on it, the conversion layer having a binder material and a plurality of phosphor particles dispersed throughout the binder material. A plurality of nanoparticles is disposed proximate to the LED chip. A plurality of light scattering particles is disposed proximate to the LED chip.

In another embodiment, a light emitting diode (LED) device comprises the following. An LED chip is disposed on a mount surface, the LED chip having a textured primary emission surface. A wavelength conversion layer is disposed on the LED chip. The conversion layer comprises: a binder material having a first refractive index; a plurality of phosphor particles dispersed throughout the binder material; and a plurality of nanoparticles dispersed throughout the binder material. A plurality of light scattering particles is arranged proximate to the LED chip.

One method of manufacturing a plurality of light emitting diode (LED) devices comprises the following. A plurality of LED devices is grown on a semiconductor wafer. A wavelength conversion layer is applied on the wafer such that each of the LED devices is covered by the conversion layer, the conversion layer comprising a plurality of nanoparticles dispersed throughout the conversion layer. A plurality of light scattering particles is arranged proximate to the LED devices.

Another embodiment of a light emitting diode (LED) device comprises the following. An LED chip is disposed on a mount surface, the LED chip having a textured primary emission surface. A wavelength conversion layer is disposed on the LED chip. The conversion layer comprises: a binder material having a first refractive index; a plurality of phosphor particles dispersed throughout the binder material, wherein the phosphor particles have a diameter of less than 10 nanometers or greater than 10 micrometers. A plurality of light scattering particles is arranged proximate to the LED chip.

BRIEF DESCRIPTION OF THE DRAWINGS

FIGS. 7A-7E each show a cross-sectional view of an LED device at the wafer level during various stages of a fabrication process.

DETAILED DESCRIPTION OF THE INVENTION

Figure 1:
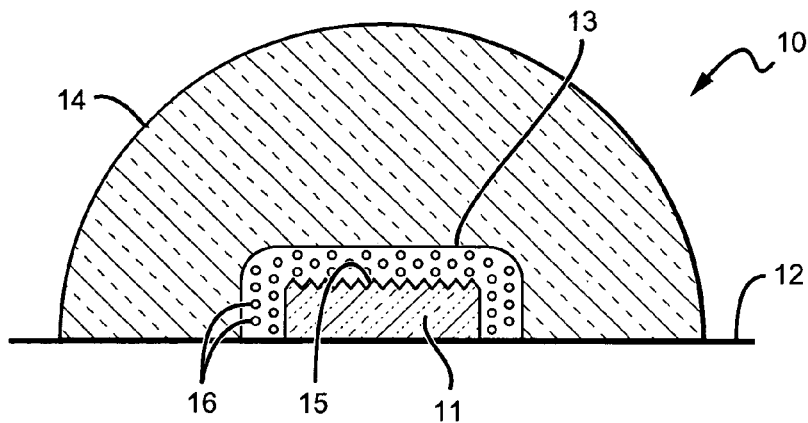
FIG. 1 is a cross-sectional view of a known LED device.

Embodiments of the present invention provide an improved light emitting device, especially a white light device, wherein the light extraction efficiency and the color temperature distribution uniformity are improved by the introduction of both nanoparticles and light scattering particles proximate to the light source. Nanoparticles having a high index of refraction are dispersed throughout a wavelength conversion layer to adjust the index of refraction of the layer for improved light extraction. Light scattering particles may be dispersed in the wavelength conversion layer or in a surrounding medium to improve the spatial correlated color temperature (CCT) distribution uniformity.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or region to another. It is understood that these terms are intended to encompass different orientations of the device in addition to the orientation depicted in the figures.

Although the ordinal terms first, second, etc., may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present invention.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote an homogenous layer of material. A single "layer" may contain various material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions or particles illustrated herein but are to include deviations in shapes that result, for example, from manufacturing. A region illustrated or described as rectangular, for example, will typically have rounded or curved features due to normal manufacturing techniques. Thus, the regions illustrated in the figures are schematic in nature; their shapes are not intended to illustrate the precise shape of a region or particle and are not intended to limit the scope of the invention. The elements are not shown in scale relative to each other but, rather, are shown generally to convey spatial and functional relationships.

The term "light" as used herein is not limited to electromagnetic radiation within the visible spectrum. For convenience, "light" may also include portions of the electromagnetic spectrum outside the visible spectrum, such as the infrared or ultraviolet spectra, for example.

Figure 2:
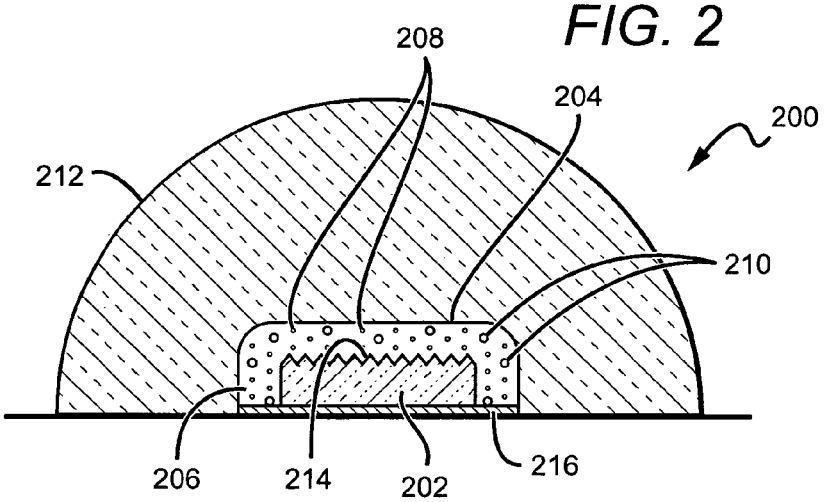
FIG. 2 is a cross-sectional view of an LED device according to an embodiment of the present invention.

FIG. 2 shows a cross-sectional view of an LED device 200 according to an embodiment of the present invention. An LED chip 202 is disposed on a mount surface. The LED 202 can emit light of different colors and can also emit radiation outside the visible spectrum, such as infrared or ultraviolet. The color of the emitted light is determined by the material properties of the semiconductor used in the chip 202. The LED chip 202 can be made from many different material systems with one suitable material being gallium nitride (GaN). In one embodiment the LED chip 202 emits blue light. As discussed above, many applications require a white light output which may be achieved by downconverting a portion of the blue light to yellow light. When emitted, the combination of blue and yellow light appears white.

The conversion process takes place in the conversion layer 204 which may be loaded with phosphors. The wavelength conversion layer 204 converts a portion of the emitted light to a different wavelength, a process that is known in the art. Yttrium aluminum garnet (YAG) is an example of a common phosphor that may be used.

In one embodiment, the phosphor comprises many different compositions and phosphor materials alone or in combination. A single crystalline phosphor can comprise yttrium aluminum garnet (YAG, with chemical formula $Y_3Al_5O_{12}$). The YAG host can be combined with other compounds to achieve the desired emission wavelength. In one embodiment where the single crystalline phosphor absorbs blue light and re-emits yellow, the single crystalline phosphor can comprise YAG:Ce. This embodiment is particularly applicable to LEDs that emit a white light combination of blue and yellow light. A full range of broad yellow spectral emission is possible using conversion particles made of phosphors based on the $(Gd,Y)_3(Al,Ga)_5O_{12}$:Ce system, which include $Y_3Al_5O_{12}$:Ce (YAG). Other yellow phosphors that can be used for white emitting LED chips include:

$Tb_{3-x}RE_xO_{12}$:Ce (TAG);
RE=Y, Gd, La, Lu; or
$Sr_{2-x-y}Ba_xCa_ySiO_4$:Eu.

Other compounds can be used with a YAG host for absorption and re-emission of different wavelengths of light. For example, a YAG:Nb single crystal phosphor can be provided to absorb blue light and re-emit red light. First and second phosphors can also be combined for higher CRI white (i.e., warm white) with the yellow phosphors above combined with red phosphors. Various red phosphors can be used including:
$Sr_xCa_{1-x}S:Eu, Y; Y=halide$;
$CaSiAlN_3:Eu$; or
$Sr_{2-y}Ca_ySiO_4:Eu$.

Other phosphors can be used to create saturated color emission by converting substantially all light to a particular color. For example, the following phosphors can be used to generate green saturated light:
$SrGa_2S_4:Eu$;
$Sr_{2-y}Ba_ySiO_4:Eu$; or
$SrSi_2O_2N_2:Eu$.

The following lists some additional suitable phosphors that can be used as conversion particles, although others can be used. Each exhibits excitation in the blue and/or UV emission spectrum, provides a desirable peak emission, has efficient light conversion, and has acceptable Stokes shift:

YELLOW/GREEN
$(Sr,Ca,Ba) (Al,Ga)_2S_4:Eu^{2+}$
$Ba_2(Mg,Zn)Si_2O_7:Eu^{2+}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$

RED
$Lu_2O_3:Eu^{3+}$
$(Sr_{2-x}La_x) (Ce_{1-x}Eu_x)O_4$
$Sr_2Ce_{1-x}Eu_xO_4$
$Sr_{2-x}Eu_xCeO_4$
$SrTiO_3:Pr^{3+},Ga^{3+}$
$CaAlSiN_3:Eu^{2+}$
$Sr_2Si_5N_8:Eu^{2+}$

Within the conversion layer 204 phosphor particles (not shown) are dispersed throughout a binder material 206 such as silicone. The refractive index (RI) of the phosphor particles and the RI of the binder 206 can be the same, or they can be different. However, the difference is usually minimized to reduce scattering.

A plurality of nanoparticles 208 is disposed proximate to the LED chip 202. The nanoparticles 208 may be dispersed throughout the binder material 206 of the conversion layer 204. By including nanoparticles with a RI higher than that of the host medium—the binder material 206, in this embodiment—the effective RI of the host medium can be increased. This is done to more closely match the RI of the binder material 206 (e.g., silicone with an RI≈1.5) with the RI of the phosphor particles (RI≈1.8). When these two elements are not closely index-matched, the difference in RI results in light scattering as the typical phosphor particles are substantially larger (~5.5 μm) than the wavelength of light emitted from the LED chip 202 (e.g., ~450 nm for a blue emitter). Light extraction efficiency increases as the difference in RI between the phosphor and the binder material 206 is reduced. However, the efficiency only increases up to a point. If the effective RI of the binder material 208 get too high, the light extraction efficiency will actually decrease due to total internal reflection at the flat interface of the conversion layer 204 and any surrounding medium having a lower RI (e.g., silicone or air). One acceptable effective RI for the conversion layer is approximately 1.7, providing improved index-matching with manageable levels of total internal reflection.

The nanoparticles 208 may comprise several different materials. One acceptable material is titanium dioxide ($TiO_2$). Other acceptable materials include diamond, silicon carbide, silicon nanoparticles, and others. The RI of both $TiO_2$ and diamond is approximately 2.5. The volume of nanoparticles that is needed to adjust the effective RI of the conversion layer by a certain amount can be easily calculated using Vegard's Law which states that the relationship between volume and RI is linear. For example, if the conversion layer material has a RI of 1.5 and the target effective RI is 1.7, then the conversion layer 204 should comprise approximately 20% $TiO_2$ nanoparticles by volume. Other material combinations and compositions may also be used. For example some embodiments may have greater than 5% nanoparticles by volume. Other embodiments may have greater than 10% nanoparticles by volume. Still other embodiments may include 20-40% by volume nanoparticle loading. The concentration of the nanoparticles depends on factors such as the material being used and the desired RI adjustment.

Index-matching the binder material 206 with the phosphor particles reduces scattering within the conversion layer 204. This reduction in scattering adversely affects the uniformity of the color temperature distribution in the far-field. To compensate for this negative effect, light scattering particles are introduced into the device.

Light scattering particles (LSPs) 210 are disposed proximate to the LED chip 202. This technique is known in the art and only briefly discussed herein. The LSPs 210 are distributed around the LED chip 202 so that the individual photons are redirected before they are emitted to randomize the point where they exit the device 200. This has the effect of evening out the color temperature distribution such that an outside observer sees roughly the same color over a broad range of viewing angles. Embodiments of the present invention provide good spatial color temperature uniformity which is a range of less than 500K at cool-white temperatures (5000-7000K) and a range of less than 300K for warm-white temperatures (2500-4000K).

The LSPs 210 can comprise many different materials, including:
silica gel;
silicon nanoparticles;
zinc oxide (ZnO);
yttrium oxide ($Y_2O_3$);
titanium dioxide ($TiO_2$);
barium sulfate ($BaSO_4$);
alumina ($Al_2O_3$);
fused silica ($SiO_2$);
fumed silica ($SiO_2$);
aluminum nitride;
glass beads;
diamond;
zirconium dioxide ($ZrO_2$);
silicon carbide (SiC);
tantalum oxide ($TaO_5$);
silicon nitride ($Si_3N_4$);
niobium oxide ($Nb_2O_5$);
boron nitride (BN); or
phosphor particles (e.g., YAG:Ce, BOSE)

Other materials not listed may also be used. Various combinations of materials or combinations of different forms of the same material may be used to achieve a particular scattering effect.

These LSPs 210 should have a high index of refraction relative to the surrounding medium 212, creating a large index of refraction differential between the materials. Because the index differential causes refraction, it would also be possible to use an LSP material that has a low index of refraction relative to the surrounding medium. The LSPs 210 create localized non-uniformities in the medium that force the light to deviate from a straight path.

When the light strikes one or more of the scattering particles 210 the index of refraction differential between the medium and the particles 210 causes the light to refract and travel in a different direction. A large index of refraction differential yields a more drastic direction change for an incident photon. For this reason, materials with a high index of refraction work well in mediums such as silicone or epoxy. Another consideration when choosing a light scattering material is the optical absorbance of the material. Large particles backscatter more of the light inside the package before it can escape the device 200, decreasing the total luminous output of the device. Thus, preferred scattering particle materials have a high index of refraction relative to the medium and a particle size comparable to the wavelength of the light propagating through the host medium. Ideally, LSPs ensure maximum forward or sideways scattering effect for a given spectrum while minimizing light loss due to backscattering and absorption.

The LSPs 210 can be dispersed throughout various elements so long as they are proximate to the LED chip 202 such that substantially all of the emitted light has a probability of interacting with the LSPs 210. For example, in the embodiment shown in FIG. 2 the LSPs 210 are disposed throughout the binder material 206 along with the nanoparticles 208 and the phosphor (not shown). Because the conversion layer 204 is disposed on the LED chip 202, substantially all of the emitted light travels through the conversion layer where the LSPs 210 are dispersed before being emitted from the device 200. The LSPs 210 may also be disposed in other elements as discussed in more detail below.

Various percentages of composition of the LSPs 210 can be used as dictated by the application. Depending on the materials used, the LSPs 210 will typically be found in concentrations ranging from 0.01% to 5% by volume. Other concentrations can be used; however, the loss due to absorption increases with the concentration of the scattering particles. Thus, the concentrations of the LSPs should be chosen in order to maintain an acceptable loss figure.

In some embodiments the light scattering particles have diameters that range from 0.1 μm to 2 μm. In some cases it may be desirable to use LSPs of different sizes. For example, in one embodiment a first plurality of LSPs may comprise titania, silica and diamond, and a second plurality of LSPs may comprise fused silica, titania and diamond. Many other combinations are possible to achieve a desired color temperature distribution.

The device 200 includes an overmolded encapsulant 212 that is disposed over the LED chip 202 and the conversion layer 204. Encapsulants, often used to improve package light extraction efficiency and to protect the LED and the conformal layers, are known in the art and may be made from several materials such as silicone, for example. The encapsulant 212 may also function as beam-shaping element, such as a lens. This particular encapsulant 212 is hemispherical, although other shapes are possible.

The LED chip 202 has a textured light emission surface 214 included to increase light extraction from the LED chip 202 by reducing total internal reflection (TIR). There are many known techniques that may be used to modify a surface of a semiconductor material. A surface may be modified by an additive process wherein a material is added to the surface which gives it a modified texture. A surface can also be modified with subtractive processes wherein material is removed from the surface to create the modified texture. Subtractive processes, such as etching, cutting and grinding, are known in the art and frequently used to texture a surface. Opposite the textured light emission surface 214, the LED chip 202 has a reflective element 216 such as a layer of reflective material. The reflective element 216 redirects some of the light generated in the LED chip 202 back towards the textured light emission surface 214. The reflective element 214 may comprise a thick silver mirror, for example.

Figure 3:
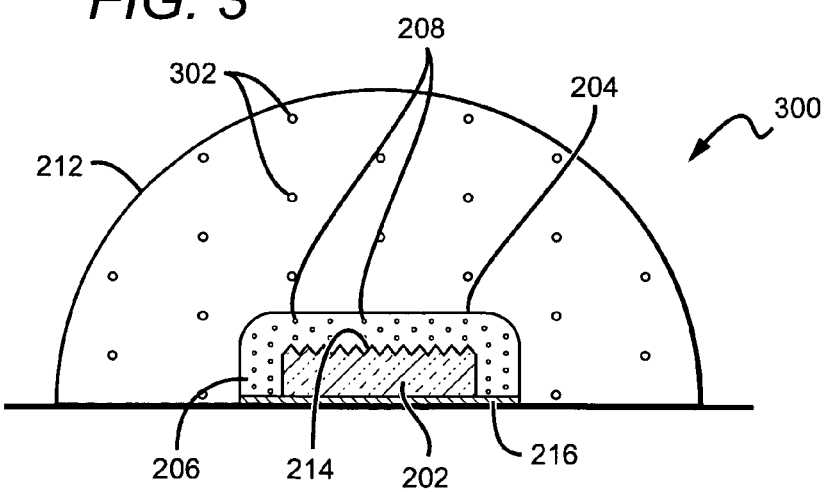
FIG. 3 is a cross-sectional view of an LED device according to an embodiment of the present invention.

FIG. 3 shows a cross-sectional view of another LED device 300 according to an embodiment of the present invention. The LED device 300 shares several common elements with the LED device 200. In this particular embodiment, the LSPs 302 are dispersed throughout the encapsulant 212. In this configuration, the LSPs scatter the light that has passed from the conversion layer 204 into the encapsulant 212. The LSPs 302 may be dispersed uniformly throughout the encapsulant, or they may be clustered in various regions to achieve a particular output profile.

Figure 4:
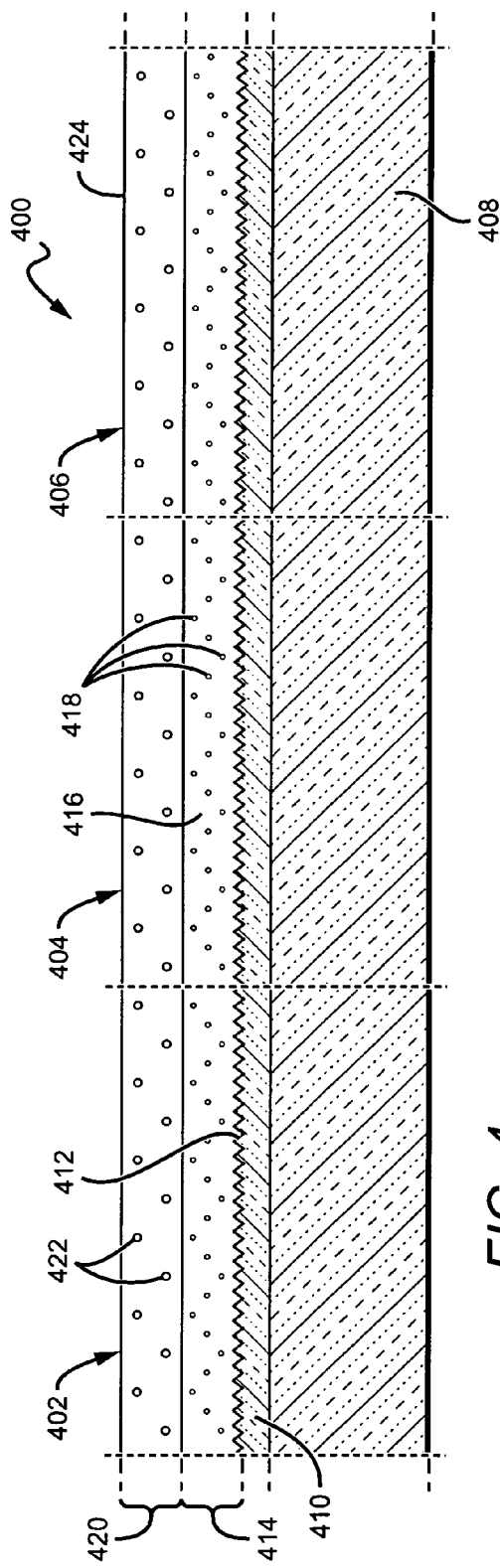
FIG. 4 is a cross-sectional view of plurality of LED devices according to an embodiment of the present invention.

FIG. 4 is a cross-sectional view of a plurality of unsingulated LED devices 400 according to an embodiment of the present invention. The portion shown comprises three LED devices 402, 404, 406 formed on a substrate 408. Dashed vertical lines represent cut-lines along which the devices 402, 404, 406 will be singulated. The semiconductor layers 410 are grown on the substrate 408. The surface of the semiconductor layers 410 opposite the substrate 408 is a textured surface 412.

A conversion layer 414 is disposed on the textured surface 412. The conversion layer 414 may be applied with a spin-coating process, for example. The conversion layer 414 comprises phosphor particles (not shown) within a binder material 416 such as silicone, for example. A plurality of nanoparticles 418 is dispersed throughout the binder material 416. The nanoparticles 418 can be mixed into the binder material 416 with the phosphor and then spin-coated onto the semiconductor layers 410. Other methods of mixing the nanoparticles 418 with the binder material 416 and applying the conversion layer 414 may also be used.

A flat encapsulant 420 is disposed on the conversion layer 414. The encapsulant 420 may be made of epoxy, silicone, or other suitable materials. In this particular embodiment LSPs 422 are dispersed throughout the encapsulant 420. In another embodiment the LSPs 422 may be dispersed in the conversion layer 414. As discussed above, the LSPs 422 improve the color temperature distribution uniformity of the output profile. The emission surface 424 of the encapsulant 420 can be smooth or it can be textured to reduce TIR at the encapsulant/air interface. The flat encapsulant 420 may be designed to shape the outgoing light beam.

After the plurality of devices 400 is finished, the individual devices 402, 404, 406 are singulated using known processes. The devices 402, 404, 406 may then undergo packaging processes to yield a finished product; however, all the elements shown in FIG. 4 may be introduced at the wafer level.

Figure 5:
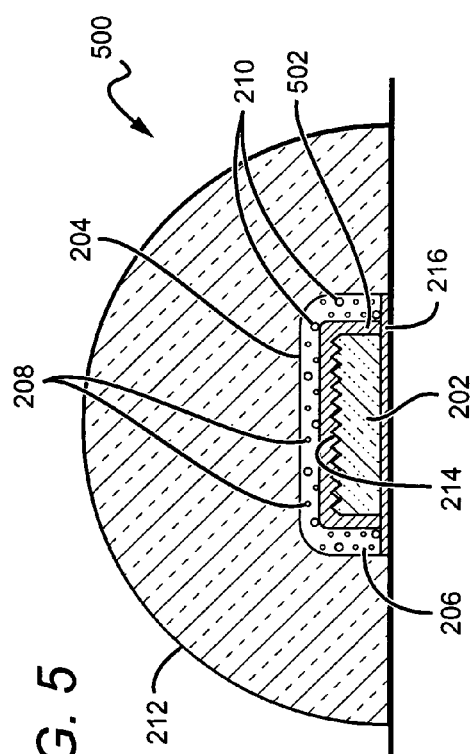
FIG. 5 is a cross-sectional view of an LED device according to an embodiment of the present invention.

FIG. 5 shows a cross-sectional view of an LED device 500 according to an embodiment of the present invention. The device 500 comprises several similar elements as the device 200 shown in FIG. 2. In this particular embodiment, a spacer layer 502 is interposed between the LED chip 202 and the conversion layer 204. The spacer layer 502 can be made of many different materials such as silicone, epoxy, oil, dielectrics, and other materials. The material should be chosen such that the RI of the spacer layer 502 is smaller than the RI of the LED chip 202 and the RI of the conversion layer 204.

The spacer layer 502 may increase light extraction efficiency when the phosphor and the binder are not exactly index-matched. As discussed above, the nanoparticles 208 are used to adjust the effective RI of the conversion layer 204. However, the spacer layer 502 can compensate for those cases where the nanoparticles 208 do not produce a large enough RI shift in the conversion layer 204 to match the phosphor. For example, in some embodiments it may be desirable to load the conversion layer 204 with a high volume of phosphors. There would then be less space within the conversion layer 204 for nanoparticles. The spacer layer 502 can work in concert with the nanoparticles 208 to reduce the amount of light that is reflected back into the LED chip 202 where it may be absorbed. To perform this function, the spacer layer 502 is chosen to have an RI that is less than the conversion layer 204. A portion of the light that enters the spacer layer 502 is then incident on the boundary between the spacer layer 502 and the conversion layer 204. At this boundary the light sees a step-up in RI and passes into the conversion layer 204 with minimal reflection. If the light is reflected or backscattered in the conversion layer 204, it will see the RI step-down at the spacer layer 502 boundary and has a finite chance of being reflected back into the conversion layer 204 because of the TIR phenomenon.

Figure 6:
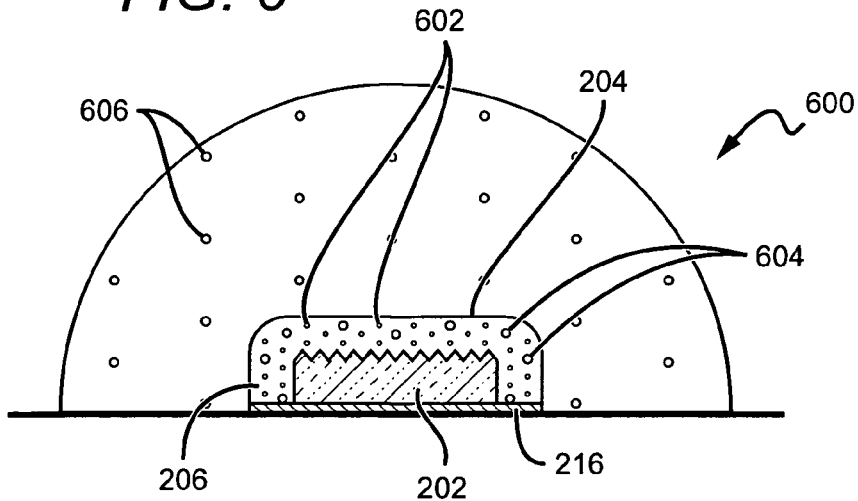
FIG. 6 is a cross-sectional view of an LED device according to an embodiment of the present invention.

FIG. 6 illustrates a cross-sectional view of an LED device 600 according to another embodiment of the present invention. The device 600 comprises several similar elements as the device 200 shown in FIG. 2. An LED chip 202 is disposed on a mount surface. A wavelength conversion layer 204 covers the LED chip 202. In this particular embodiment, scattering within the conversion layer 204 is minimized by using phosphor particles that have a relatively large or relatively small diameter in comparison to the wavelength of light emitted from the LED chip 202. Small phosphor particles 602 and large phosphor particles 604 are distributed throughout the binder material 206 of the conversion layer 204. All of the phosphor particles 602, 604 are capable of producing conversion events.

In one embodiment, the small phosphor particles should have a diameter of less than 10 nm; the large phosphor particles should have a diameter greater than 10 µm. It is known in the art that particles that have diameters much larger or smaller than the wavelength of incident light have a diminished scattering effect on that light. Similarly as the conversion layers having nanoparticles, the conversion layer 204 in the device 600 is substantially scatter-free, improving the overall extraction efficiency of the device. As discussed above, in order to ensure a uniform color temperature distribution in the output, light scattering particles 606 are dispersed proximate to the LED chip 202. In this embodiment, the light scattering particles 606 are distributed throughout the encapsulant 212. In other embodiments, the light scattering particles 212 may be dispersed in the conversion layer 204 along with the small and large phosphor particles 602, 604 or in both the conversion layer 204 and the encapsulant 212.

Figure 7A:
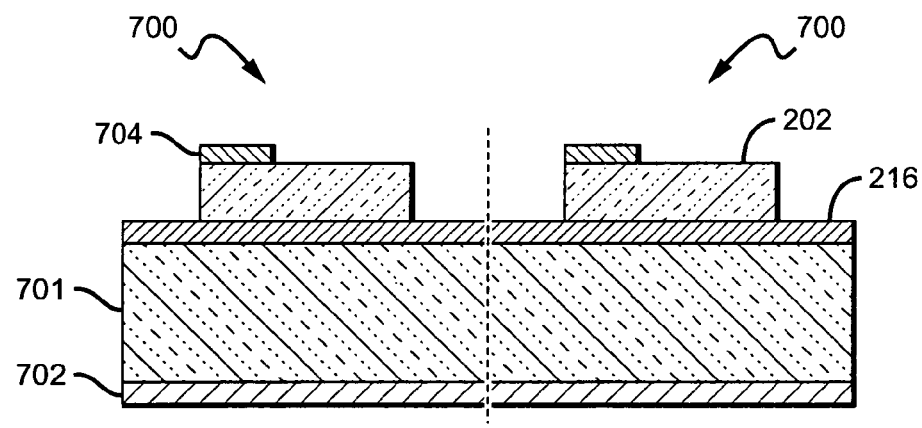

One advantage of the embodiments discussed herein is the ability to manufacture the improved LED devices at the wafer level. FIGS. 7a-7f show a series of cross-sectional views of two LED devices 700 according to an embodiment of the present invention during intermediate stages of the wafer-level fabrication process. Referring to FIG. 7A, the LED devices 700 are shown at the wafer level. That is, the devices 700 have not been through all the steps necessary before being separated/singulated from wafer into individual devices. A vertical dashed line is included to show a separation or dicing line between the LED devices 700, and, following additional fabrication steps, the LED devices 700 can be separated as shown in FIG. 7E. FIGS. 7A-7E show only two devices at the wafer level; however, it is understood that many more LED devices can be formed from a single wafer. For example, when fabricating LED devices having a 1 millimeter (mm) square size, up to 4500 LED devices can be fabricated on a 3 inch wafer. Typical thicknesses for LED chips may be 50 µm, 100 µm, 200 µm, and as high as 600 µm and beyond.

Each of the LED devices 700 comprises a semiconductor LED 202 as described for previous embodiments. The LED devices 700 are shown as separate devices on a substrate 701. This separation can be achieved by having portions of the semiconductor LED layer etched to form open areas between the LED 202. In other embodiments, the semiconductor layer may remain continuous on the substrate 701 and can be separated when the LED devices 700 are singulated.

A substrate may be a growth substrate or a carrier substrate. In some embodiments, the substrate may have a diameter of about 3 inches. It is understood that substrates may come in many sizes larger and smaller than 3 inches, all of which may be used in various embodiments of the present invention. A growth substrate typically is used in the fabrication of the semiconductor LED layer and may be made of many materials such as sapphire, silicon carbide, silicon, silicon on insulator, germanium, aluminum nitride, and gallium nitride. A suitable growth substrate for a Group III-Nitride based semiconductor layers is 4 H or 6 H polytype silicon carbide, although other silicon carbide polytypes may be used including 3 C and 15 R. Silicon carbide substrates are available from Cree, Inc., of Durham, N.C. and methods for producing them are set forth in the scientific literature as well as in U.S. Pat. Nos. Re. 34,861; 4,946,547; and 5,200,022.

The substrate 701 in FIGS. 7A-7E may also be a carrier substrate. Suitable carrier substrates may include silicon, metal alloys such as copper alloys, single crystalline phosphors, etc. For these embodiments, the semiconductor LED 202 is flip-wafer or flip-chip bonded to the carrier substrate 701. A flip-wafer or flip-chip process typically involves first growing an LED including, in order, a n-type region, an active region, and by a p-type region on a growth substrate and then transferring or mounting it to the carrier substrate. The transferring/mounting step usually involves flipping the LED device and growth substrate over and mounting it such that the p-type region is closest to the carrier substrate. The LED may be mounted to the carrier substrate by one or more bonding/metal layers. The bonding/metal layers may comprise a reflective element 216 arranged to reflect light emitted or reflected in a direction toward the substrate 701 back toward the top of the device. The growth substrate may then be removed using a known grinding and/or etching process that may expose at least a portion of the n-type region. The n-type region may then be patterned, shaped, or textured to enhance light extraction. In other embodiments, the growth substrate or at least portions thereof remain. The growth substrate or the remaining portions may then be patterned, shaped, or textured to enhance light extraction. Example manufacturing techniques may be described in U.S. Publication No. 20060049411 filed May 18, 2004 to Nakamura et al, entitled Method For Fabricating Group-III Nitride Devices and Devices Fabricated Using Method, and U.S. Publication No. 20060189098 filed Feb. 23, 2005 to Edmond, entitled Substrate Removal Process For High Light Extraction LEDs, and U.S. Publication No. 20060060877 filed Sep. 22, 2004 to Edmond et al, entitled High Efficiency Group III Nitride-Silicon Carbide Light Emitting Diode, and U.S. Publication No. 20060060874 filed Mar. 17, 2005 to Edmond et al, entitled High Efficiency Group III Nitride LED With Lenticular Surface, all assigned to Cree, Inc.

Each of the LED devices 700 may have first and second contacts 702, 704. FIGS. 7A-7E show vertical geometry devices with the first contact 702 being on the substrate 701 and the second contact 704 on the LED 202. The first contact 702 is shown as one layer on the substrate 701, but when the LED devices 700 are singulated, the first contact 702 will also be separated such that each device 700 has its own portion of the first contact 702. It is understood that first and second contacts 702, 704 may comprise a metal such as platinum (Pt), silver (Ag), nickel (Ni), an alloy thereof, or a transparent conductive oxide such as indium tin oxide (ITO), zinc oxide (ZnO), etc. As would be understood by one of skill in the art with the benefit of this disclosure, the present invention may also be used with LEDs having a lateral geometry wherein both contacts are on the same side of the device.

Figure 7B:
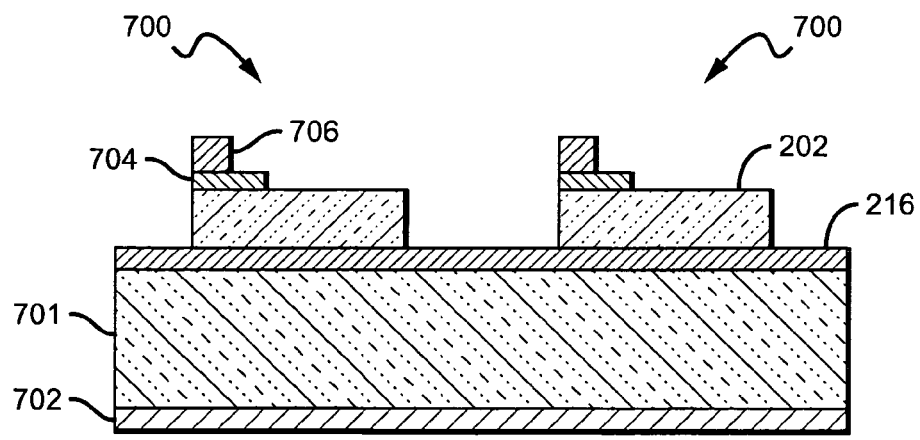

Referring now to FIG. 7B, a contact pedestal 706 may be formed on the second contact 704 that is utilized to make electrical contact to the second contact 704 after various coatings are applied. The pedestal 706 may be formed of many different electrically conductive materials and can be formed using many different known physical or chemical deposition processes such as electroplating, electroless plating, or stud bumping, with a suitable contact pedestal 706 being gold (Au) and formed by stud bumping. This method is typically the easiest and most cost effective approach. The pedestal 706 can be made of other conductive materials beyond Au, such as copper (Cu), nickel (Ni), Indium (In), or combinations thereof. For the vertical geometry type device 700 shown in FIGS. 7A-7E, only one pedestal 706 is needed. In alternative embodiments related to lateral geometry or large-area vertical geometry devices, additional pedestals may also be formed.

The process of forming stud bumps is generally known and only discussed briefly herein. Stud bumps are placed on the contacts (bond pads) through a modification of the "ball bonding" process used in conventional wire bonding. In ball bonding, the tip of the bond wire is melted to form a sphere. The wire bonding tool presses this sphere against the contact, applying mechanical force, heat, and/or ultrasonic energy to create a metallic connection. The wire bonding tool next extends the gold wire to the connection pad on the board, substrate, or lead frame, and makes a "stitch" bond to that pad, and finishes by breaking off the bond wire to begin another cycle. For stud bumping, the first ball bond is made as described, but the wire is then broken close to the ball. The resulting gold ball, or "stud bump" remains on the contact and provides a permanent, reliable connection through the underlying contact metal. The stud bumps can then be flattened (or "coined") by mechanical pressure to provide a flatter top surface and more uniform bump heights, while at the same time pressing any remaining wire into the ball.

In FIG. 4C, the devices 700 are then blanketed by a conversion layer 708 (similarly as the conversion layer 414 shown in FIG. 4) using techniques such as electrophoretic deposition, spin or spray coating, screen printing, and/or dispensing. Although not shown in FIGS. 7A-7F, the conversion layer 708 may contain nanoparticles, light scattering particles, or combinations of both, as discussed in detail above. The conversion layer 708 may also comprise phosphors of different size. The conversion layer 708 has a thickness such that it may cover/bury the pedestal 706. One advantage of depositing the conversion layer 708 at the wafer level is the elimination of the need for precise alignment over particular devices or features. Instead, the entire wafer is covered, resulting in a simpler and more cost effective fabrication process.

Referring now to FIG. 7D, the conversion layer 708 is thinned or planarized so that the pedestals 706 are exposed through the top surface of the conversion layer 708. Many different thinning processes can be used including known mechanical or chemical processes such as grinding, lapping, polishing, the use of a squeegee, and physical or chemical etching. The thinning process not only exposes the pedestals 706, but also allows for planarizing and controlling the thickness of the light conversion layer 708, which in some embodiments may control the intensity and the color point of the emitted light by controlling the amount of phosphor present.

Referring now to FIG. 7E, individual devices 700 may be singulated using known methods such as dicing, scribe and breaking, or etching. The singulating process separates each of the devices 700 with each having substantially the same thickness of conversion layer 708. This allows for reliable and consistent fabrication of LED devices 700 having similar emission characteristics. Following singulation, the LED devices 700 may be mounted in a package, or to a submount or printed circuit board (PCB) without the need for further processing to add phosphor or scattering elements. In one embodiment the package/submount/PCB may have conventional package leads with the pedestals electrically connected to the leads. A conventional encapsulant (such as the encapsulant 212 shown in FIG. 2) may then surround the LED chip and electrical connections. In another embodiment, the LED chip may be enclosed by a hermetically sealed cover with an inert atmosphere surrounding the LED chip at or below atmospheric pressure.

Many additional embodiments are possible which feature additional elements. For example, LED devices according to embodiments of the present invention may include wavelength-specific filter layers, custom electrical contacts, lenses, and many other elements. It is understood that embodiments of the present invention are not limited to those exemplary combinations disclosed herein.

Although the present invention has been described in detail with reference to certain preferred configurations thereof, other versions are possible. Therefore, the spirit and scope of the invention should not be limited to the versions described herein.

I claim:

1. A light emitting diode (LED) device, comprising:
   an LED chip on a mount surface;
   a conversion layer on said LED chip, said conversion layer comprising a binder material and a plurality of phosphor particles throughout said binder material;
   a plurality of nanoparticles throughout said binder material such that the effective refractive index of a combination of said binder material and said nanoparticles is between the refractive index of said phosphor particles and the refractive index of a surrounding medium; and
   a light scattering layer on said conversion layer and in contact with said mount surface, said light scattering layer comprising a plurality of light scattering particles throughout said surrounding medium, the refractive index of said light scattering particles being greater or less than the refractive index of said surrounding medium, wherein light conversion only takes place in the conversion layer.

2. The LED device of claim 1, wherein said conversion layer comprises greater than 5% nanoparticles by volume.

3. The LED device of claim 1, wherein said conversion layer comprises greater than 10% nanoparticles by volume.

4. The LED device of claim 1, wherein said conversion layer comprises 20-40% nanoparticles by volume.

5. The LED device of claim 1, wherein said conversion layer comprises approximately 20% nanoparticles by volume.

6. The LED device of claim 1, said light scattering particles comprising particles comprising a diameter of approximately 0.1-2 mm.

7. The LED device of claim 1, wherein said conversion layer comprises approximately 0.01-5% light scattering particles by volume.

8. The LED device of claim 1, further comprising an encapsulant substantially enveloping said LED chip and said conversion layer, such that said encapsulant comprises said light scattering layer.

9. The LED device of claim 8, wherein additional light scattering particles are throughout said encapsulant.

10. The LED device of claim 8, wherein said light scattering particles are throughout said binder material and said encapsulant.

11. The LED device of claim 1, wherein said nanoparticles are throughout said binder material such that the effective refractive index of said combination of said binder material and said nanoparticles is approximately 1.7.

12. The LED device of claim 1, further comprising a spacer layer interposed between said LED chip and said conversion layer.

13. The LED device of claim 1, wherein said nanoparticles comprise titanium (IV) dioxide ($TiO_2$) particles.

14. The LED device of claim 1, wherein said nanoparticles comprise diamond particles.

15. The LED device of claim 1, wherein a primary emission surface of said LED chip is textured.

16. The LED device of claim 1, further comprising a reflective element on said LED chip opposite said conversion layer.

17. The LED device of claim 1, wherein said LED chip is nitride based.

18. The LED device of claim 1, wherein said nanoparticles have a higher refractive index than said binder material.

19. A light emitting diode (LED) device, comprising:
   an LED chip on a mount surface, said LED chip comprising a textured primary emission surface;
   a wavelength conversion layer comprising a flat primary emission surface on said LED chip, wherein light conversion only takes place within said wavelength conversion layer, said conversion layer comprising:
      a binder material comprising a first refractive index;
      a plurality of phosphor particles throughout said binder material;
      a plurality of nanoparticles throughout said binder material such that the effective refractive index of a combination of said binder material and said nanoparticles is between the refractive index of said phosphor particles and the refractive index of a surrounding medium; and
   an encapsulant over said wavelength conversion material and in contact with said mount surface, said encapsulant comprising a plurality of light scattering particles throughout said surrounding medium, the refractive index of said light scattering particles being greater or less than the refractive index of said surrounding medium.

20. The LED device of claim 19, wherein said conversion layer comprises approximately 0.01-5% light scattering particles by volume.

21. The LED device of claim 19, wherein said encapsulant substantially envelopes said LED chip.

22. The LED device of claim 21, wherein additional light scattering particles are throughout said encapsulant.

23. The LED device of claim 21, wherein said light scattering particles are throughout said binder material and said encapsulant.

24. The LED device of claim 19, wherein said nanoparticles are throughout said binder material such that the effective refractive index of said combination of said binder material and said nanoparticles is approximately 1.7.

25. The LED device of claim 19, wherein said conversion layer comprises greater than 5% nanoparticles by volume.

26. The LED device of claim 19, wherein said conversion layer comprises greater than 10% nanoparticles by volume.

27. The LED device of claim 19, wherein said conversion layer comprises 20-40% nanoparticles by volume.

28. The LED device of claim 19, wherein said conversion layer comprises approximately 20% nanoparticles by volume.

29. The LED device of claim 19, said nanoparticles comprising titanium dioxide ($TiO_2$) particles.

30. The LED device of claim 19, said nanoparticles comprising diamond particles.

31. The LED device of claim 19, said light scattering particles comprising fused silica particles.

32. The LED device of claim 19, wherein said light scattering particles have a diameter of approximately 0.1-2 mm.

33. The LED device of claim 32, said light scattering particles comprising titanium dioxide ($TiO_2$) particles.

34. The LED device of claim 32, said light scattering particles comprising diamond particles.

35. The LED device of claim 32, said light scattering particles comprising fused silica particles.

36. The LED device of claim 19, further comprising a reflective element on said LED chip opposite said conversion layer.

37. The LED device of claim 19, wherein said LED chip comprises aluminum gallium indium nitride (AlGaInN) semiconductor layers.

38. The LED device of claim 19, wherein said nanoparticles have a higher refractive index than said binder material.

39. The LED device of claim 19, further comprising a spacer layer interposed between said textured primary emission surface and said conversion layer.

40. A light emitting diode (LED) device, comprising:
   an LED chip on a mount surface, said LED chip comprising a textured primary emission surface;
   a wavelength conversion layer on said LED chip, wherein said light conversion only takes place within said wavelength conversion layer, said conversion layer comprising:
      a binder material comprising a first refractive index;
      a plurality of phosphor particles throughout said binder material, wherein said plurality of phosphor particles comprises a mixture of phosphor particles comprising a diameter of less than approximately 10 nanometers and phosphor particles comprising a diameter greater than approximately 10 micrometers; and
      a spacer layer interposed between said textured primary emission surface and said conversion layer, wherein said spacer layer has an index of refraction less than said conversion layer and said LED chip, wherein said spacer layer is conformal to said LED chip and wherein said wavelength conversion material is conformal to said spacer layer; and
   an encapsulant over said LED chip and in contact with said mount surface comprising a plurality of light scattering particles throughout said encapsulant, the refractive index of said light scattering particles being greater or less than the refractive index of said encapsulant.

41. The LED device of claim 40, wherein said conversion layer comprises approximately 0.01-5% light scattering particles by volume.

42. The LED device of claim 40, wherein said encapsulant substantially envelopes said LED chip.

43. The LED device of claim 42, wherein additional light scattering particles are throughout said encapsulant.

44. The LED device of claim 40, wherein said light scattering particles are throughout said binder material and said encapsulant.

45. The LED device of claim 40, said light scattering particles comprising titanium dioxide (TiO2) particles comprising a diameter of approximately 0.1-2 mm.

46. The LED device of claim 40, said light scattering particles comprising diamond particles comprising a diameter of approximately 0.1-2 mm.

47. The LED device of claim 40, said light scattering particles comprising fused silica particles comprising a diameter of approximately 0.1-2 mm.

48. The LED device of claim 40, further comprising a reflective element on said LED chip opposite said conversion layer.

49. The LED device of claim 40, wherein said LED chip comprises aluminum gallium indium nitride (AlGaInN) semiconductor layers.

50. A light emitting diode (LED) device, comprising:
an LED chip on a mount surface;
a conversion layer on said LED chip, said conversion layer comprising a binder material and a plurality of phosphor particles throughout said binder material, wherein light conversion only takes place within said conversion layer;
a plurality of nanoparticles throughout said binder material such that the effective refractive index of a combination of said binder material and said nanoparticles is increased; and
an encapsulant over said conversion layer and in contact with said mount surface, said encapsulant comprising a plurality of light scattering particles throughout said encapsulant, the refractive index of said light scattering particles being greater or less than the refractive index of said encapsulant;
wherein said effective refractive index is between the refractive index of said phosphor particles and the refractive index of said encapsulant.

51. The LED device of claim 50, wherein said nanoparticles have a diameter smaller than the wavelength of light emitted from said LED chip.

52. The LED device of claim 50, wherein said nanoparticles comprise particles comprising a diameter less than about 10 nm.

53. The LED device of claim 50, wherein said nanoparticles are configured to downconvert at least some light emitted from said LED chip.

54. The LED device of claim 50, wherein said nanoparticles exhibit excitation in the blue and/or UV emission spectrum.

55. The LED device of claim 50, wherein said LED chip is configured to emit blue light; and
wherein said nanoparticles are configured to absorb at least some of said blue light and re-emit red light.

56. The LED device of claim 50, wherein said nanoparticles comprise a second plurality of phosphor particles.

57. The LED device of claim 50, wherein said binder material is thermally conductive.

58. The LED device of claim 50, wherein said conversion layer is on a thermally conductive reflective element.

* * * * *